(12) United States Patent  
Oshida et al.

(10) Patent No.: US 9,337,093 B2  
(45) Date of Patent: May 10, 2016

(54) METHOD OF MANUFACTURING SEMICONDUCTOR DEVICE

(75) Inventors: Daisuke Oshida, Kanagawa (JP); Ippei Kume, Kanagawa (JP); Makoto Ueki, Kanagawa (JP); Manabu Iguchi, Kanagawa (JP); Naoya Inoue, Kanagawa (JP); Takuya Maruyama, Kanagawa (JP); Toshiji Taiji, Kanagawa (JP); Hirokazu Katsuyama, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 458 days.

(21) Appl. No.: 13/182,944

(22) Filed: Jul. 14, 2011

(65) Prior Publication Data

US 2012/0015517 A1 Jan. 19, 2012

(30) Foreign Application Priority Data

Jul. 15, 2010 (JP) ................................. 2010-160825

(51) Int. Cl.
*H01L 21/283* (2006.01)
*H01L 21/768* (2006.01)
*H01L 21/3105* (2006.01)
(Continued)

(52) U.S. Cl.
CPC ...... *H01L 21/76883* (2013.01); *H01L 21/3105* (2013.01); *H01L 21/76805* (2013.01); *H01L 21/76814* (2013.01); *H01L 21/76826* (2013.01); *H01L 21/76831* (2013.01); *H01L 21/76843* (2013.01); *H01L 21/76865* (2013.01); *H01L 21/76873* (2013.01); *H01L 23/5329* (2013.01); *H01L 23/53238* (2013.01); *H01L 23/53295* (2013.01); *H01L 21/02126* (2013.01);

(Continued)

(58) Field of Classification Search
CPC ................... H01L 21/76805; H01L 21/76814; H01L 21/76826; H01L 21/76831; H01L 21/76843; H01L 21/76865; H01L 21/76873; H01L 21/02126; H01L 21/02216; H01L 21/76807; H01L 21/76883; H01L 21/03
USPC .......................................................... 438/667
See application file for complete search history.

(56) References Cited

U.S. PATENT DOCUMENTS 6,921,978 B2 7/2005 Clevenger
7,101,784 B2 9/2006 Clevenger
(Continued)

FOREIGN PATENT DOCUMENTS

JP 2004-336051 A 11/2004
JP 2004-363558 A 12/2004
(Continued)

OTHER PUBLICATIONS

Japanese Office Action dated Feb. 18, 2014; Japanese Patent Application No. 2010-160825.

*Primary Examiner* — Savitr Mulpuri
(74) *Attorney, Agent, or Firm* — Young & Thompson

(57) ABSTRACT

The semiconductor device includes an insulating film that is formed using a cyclic siloxane having a six-membered ring structure as a raw material; a trench that is formed in the insulating film; and a interconnect that is configured by a metal film embedded in the trench. In the semiconductor device, a modified layer is formed on a bottom surface of the trench, in which the number of carbon atoms and/or the number of nitrogen atoms per unit volume is larger than that inside the insulating film.

4 Claims, 15 Drawing Sheets

(51) Int. Cl.
  *H01L 23/532*   (2006.01)
  *H01L 21/02*   (2006.01)
(52) U.S. Cl.
  CPC ..... *H01L21/02216* (2013.01); *H01L 21/76807* (2013.01); *H01L 2924/0002* (2013.01)

(56) References Cited

U.S. PATENT DOCUMENTS

| | | | | |
|---|---|---|---|---|
| 7,304,000 | B2* | 12/2007 | Crawford et al. | 438/725 |
| 7,585,777 | B1* | 9/2009 | Goto et al. | 438/710 |
| 8,105,935 | B2* | 1/2012 | Ohara et al. | 438/618 |
| 8,481,423 | B2* | 7/2013 | Arnold et al. | 438/623 |
| 8,492,266 | B2* | 7/2013 | Ueki et al. | 438/622 |
| 2004/0198068 | A1* | 10/2004 | Yoshie | 438/781 |
| 2004/0251547 | A1* | 12/2004 | Wu et al. | 257/751 |
| 2005/0009356 | A1 | 1/2005 | Kojima | |
| 2005/0233591 | A1* | 10/2005 | Schmitt et al. | 438/706 |
| 2007/0287301 | A1* | 12/2007 | Xu et al. | 438/780 |
| 2008/0274607 | A1* | 11/2008 | Kokura | 438/595 |
| 2009/0023286 | A1* | 1/2009 | Yang et al. | 438/618 |
| 2009/0039474 | A1* | 2/2009 | Tada et al. | 257/632 |
| 2009/0047793 | A1* | 2/2009 | Fukasawa | 438/725 |
| 2009/0075480 | A1* | 3/2009 | Matz et al. | 438/694 |
| 2009/0267198 | A1* | 10/2009 | Tada et al. | 257/635 |
| 2010/0059887 | A1* | 3/2010 | Ueki et al. | 257/741 |
| 2012/0135611 | A1* | 5/2012 | Ito et al. | 438/778 |

FOREIGN PATENT DOCUMENTS

| | | |
|---|---|---|
| JP | 2009-123886 A | 6/2009 |
| JP | 2009-289996 | 12/2009 |
| WO | WO 2007/132879 | 11/2007 |

* cited by examiner

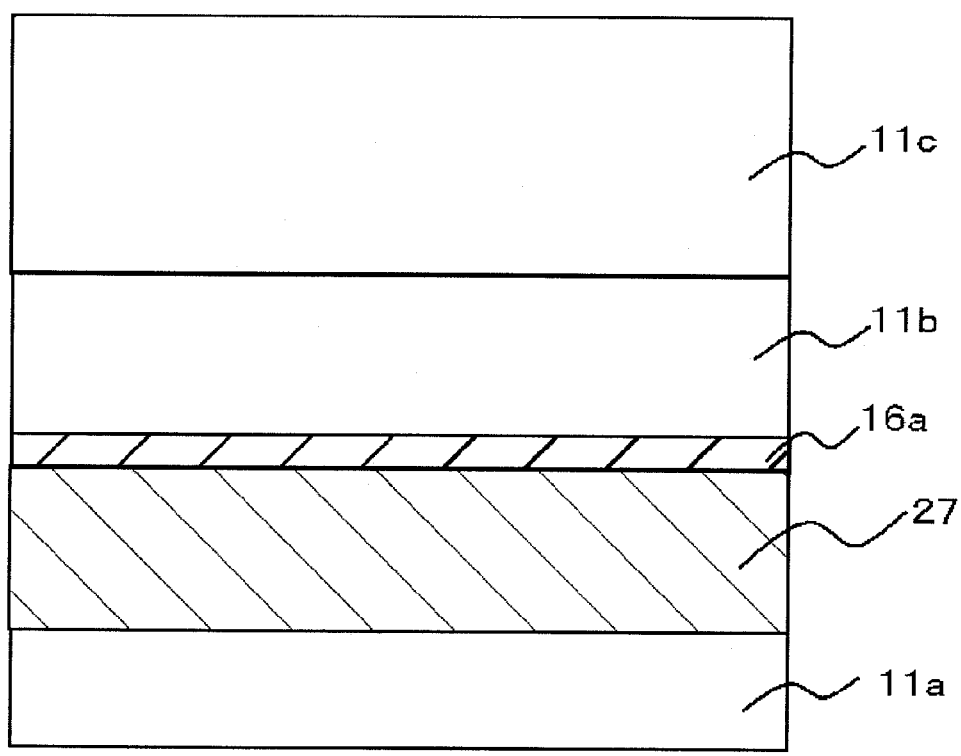

METHOD OF MANUFACTURING SEMICONDUCTOR DEVICE

CROSS-REFERENCE TO RELATED APPLICATIONS

The disclosure of Japanese Patent Application No. 2010-160825 filed on Jul. 15, 2010 including the specification, drawings and abstract is incorporated herein by reference in its entirety.

BACKGROUND

The invention relates to a semiconductor device and a method of manufacturing the same.

In recent years, with miniaturization of an ultralarge-scale integration (ULSI), miniaturization of an interconnect has been progressed. Therefore, an increase in an inter-interconnect capacitance may be a problem, and thereby the lowering of a dielectric constant in an insulating interlayer has been progressed. As technologies for forming an interconnect in the insulating film having a low dielectric constant, technologies described in WO 2007-132879 and Japanese Unexamined Patent Application Publication No. 2009-289996 may be exemplified.

In WO 2007-132879, there is disclosed that a modified layer, in which the number of carbon atoms per unit volume is smaller than that inside the insulating film and the number of oxygen atoms per unit volume is larger than that inside the insulating film, is formed in an interface between the insulating film and a metal, or the like. In WO 2007-132879, it is disclosed that such a modified layer is formed, such that the modified layer may become thin and have a superior insulation property, and it is possible to reduce an interconnect leakage current while maintaining a low inter-interconnect capacitance.

In addition, in Japanese Unexamined Patent Application Publication No. 2009-289996, it is disclosed that the insulating film having a low dielectric constant has a small mechanical strength, such that cracks may occur in the insulating interlayer or the insulating interlayer may be peeled off in a process which a large stress occurs among the processes of manufacturing the semiconductor device, such as a chemical mechanical polishing (CMP) or a packaging process. Here, in Japanese Unexamined Patent Application Publication No. 2009-289996, a SiOC film, which includes a skeleton structure portion containing SiOC and a pore forming material portion containing a hydrocarbon compound, is formed over a substrate, and the SiOC film is irradiated with light having a wavelength equal to or larger than 200 nm and equal to or smaller than 260 nm, such that when the SiOC film is irradiated with light, a three-membered ring Si—O coupling (referred to as a "six-membered ring structure" in the summary of the invention described later) or a Si—H coupling is not generated, and on the other hand, a network Si—O coupling is increased, whereby it is possible to increase the mechanical strength of the SiOC film and it is possible to avoid the deterioration in resistance to process damage.

SUMMARY

However, the present inventors found that in regard to the technologies described in WO 2007-132879 and Japanese Unexamined Patent Application Publication No. 2009-289996, the mechanical strength of the insulating film having a low dielectric constant is not sufficiently improved, such that when forming a barrier metal and a seed metal by repeating sputtering, etching, and re-sputtering, a bottom surface of a trench is also gouged (hereinafter, referred to as "sub-trench"), and the shape of the interconnect is distorted. Particularly, the inventors found that a portion directly below an outer edge of a bottom surface of the trench tends to be largely gouged compared to a portion directly below a center of the bottom surface of the trench.

The strain in the shape of the interconnect causes a deterioration of an inter-interconnect time dependent dielectric breakdown (TDDB) lifetime due to the local narrowing of an inter-interconnect space. The surface area of the facing metals is increased due to the sub-trench of the bottom surface of the trench, but this does not contribute to the resistance. Therefore, substantially, an increase of capacitance between interconnects is caused.

As described above, it is required to provide a technology for suppressing the formation of the sub-trench in the bottom surface of the trench to suppress an increase in effective capacitance between interconnects.

According to an embodiment of the invention, there is provided a semiconductor device including an insulating film that is formed with using a cyclic siloxane having a six-membered ring structure as a raw material; a trench that is formed in the insulating film; and an interconnect that is configured by a metal film embedded in the trench, wherein a modified layer is formed on a bottom surface of the trench, in which the number of carbon atoms and/or the number of nitrogen atoms per unit volume is larger than that inside the insulating film.

In addition, according to another embodiment of the invention, there is provided a method of manufacturing a semiconductor device. The method includes forming an insulating film using a cyclic siloxane having a six-membered ring structure as a raw material; forming a trench in the insulating film; forming a modified layer on a bottom surface of the trench by treating the bottom surface of the trench with plasma generated from a carbon-containing gas, a nitrogen-containing gas, or a mixed gas thereof; and forming an interconnect by embedding the trench with a metal film.

According to the embodiments of the invention, the modified layer, which has a number of carbon atoms and/or a number of nitrogen atoms per unit volume larger than that inside the insulating film, is formed on the bottom surface of the trench by treat the bottom surface of the trench with the plasma generated from the carbon-containing gas, the nitrogen-containing gas, or the mixed gas thereof. Such a modified layer has a high mechanical strength, such that when a barrier metal and a seed metal are formed, it is possible to suppress the occurrence of a sub-trench in the bottom surface of the trench. Accordingly, it is possible to suppress an increase in an effective inter-interconnect capacitance.

According to the embodiments of the invention, it is possible to suppress an increase in an effective capacitance between interconnects.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a diagram illustrating a method of manufacturing the semiconductor device according to the second embodiment;

DETAILED DESCRIPTION

Figure 1:
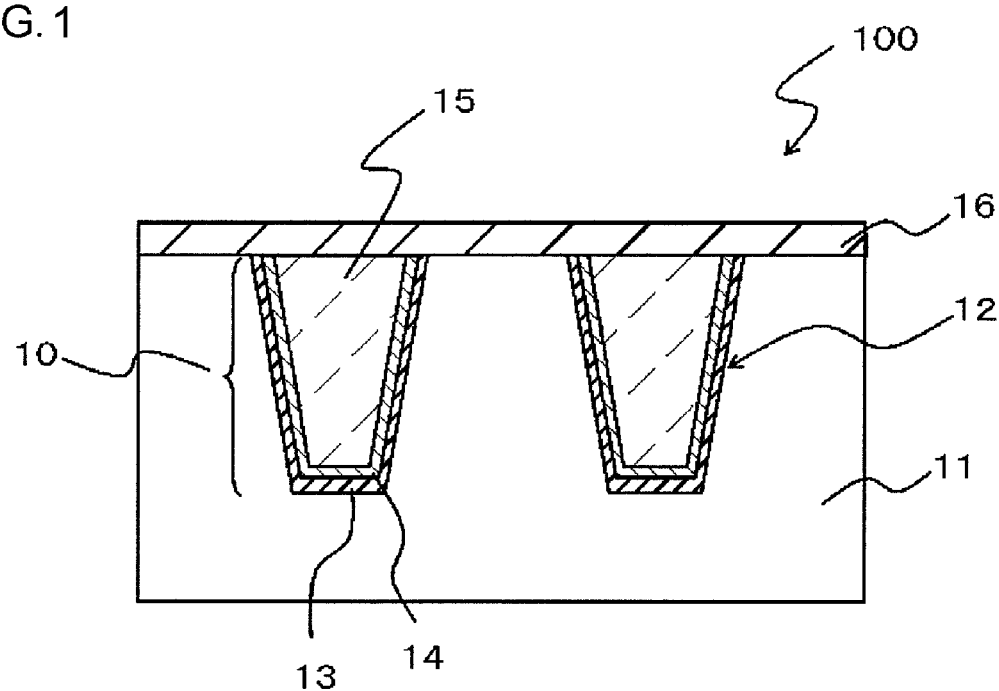
FIG. 1 is a cross-sectional diagram schematically illustrating a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, embodiments of the present invention will be described referring to the drawings. In all the drawings, same constituents are given the same numeral, and the description thereof will not be repeated.

First Embodiment

FIG. 1 shows a schematic cross-sectional diagram illustrating a semiconductor 100, which illustrates a first embodiment.

The semiconductor device 100 includes an insulating film 11 formed with using a cyclic siloxane having a six-membered ring structure as a raw material, a trench 12 formed in the insulating film 11, and an interconnect 10 configured by embedding a metal film (interconnect metal) 15 in the trench 12. In the semiconductor device 100, a modified layer 13 is formed on a bottom surface of the trench 12, in which the number of carbon atoms per unit volume and/or the number of nitrogen atoms per unit volume is larger than that inside the insulating film 11.

Although not shown in FIG. 1, the insulating film 11 is formed over a semiconductor substrate in which semiconductor devices are formed. The insulating film 11 is an insulating film having a low dielectric constant that contains at least silicon, oxygen, carbon, and hydrogen. In this embodiment, the insulating film having a low dielectric constant means an insulating film having a dielectric constant lower than that of a silicon dioxide film. The thickness of the insulating film 11 may be, for example, 50 nm to 300 nm.

In this embodiment, "cyclic siloxane having a six-membered ring structure" means a compound expressed by a formula (1), in which three Si—O units are coupled. In the formula (1), each of R1, R2, R3, R4, R5, and R6 represents hydrogen or a hydrocarbon group having 1 to 4 carbon atoms (unsaturated hydrocarbon group or saturated hydrocarbon group), R1 to R6 may be different from each other, and any two or more of R1 to R6 may be the same as each other (including a case where all of R1 to R6 are the same as each other), but at least any one of R1, R2, R3, R4, R5, and R6 is a hydrocarbon group. The hydrocarbon group (unsaturated hydrocarbon group or saturated hydrocarbon group) is any of a vinyl group, an allyl group, a methyl group, an ethyl group, a propyl group, an isopropyl group, and a butyl group. Among R1 to R6, in regard to a saturated hydrocarbon group containing two or more carbon atoms, an ethyl group (—CH$_2$CH$_3$) or a propyl group (—CH$_2$CH$_2$CH$_3$) is preferable. Among R1 to R6, in regard to the saturated hydrocarbon group, it is preferable for the group to contain three or more carbon atoms and to have a branch structure. Furthermore, it is preferable that the saturated hydrocarbon group containing three or more carbon atoms and having the branch structure is an isopropyl group (—CH(CH$_3$)$_2$) or a tertiary butyl ether group (—C(CH$_3$)$_3$).

[Chemical Formula 1]

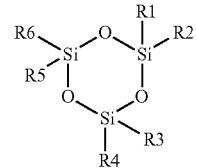

(1)

As a compound expressed by the formula (1), specifically, a trivinyl cyclotrisiloxane derivative expressed by a formula (2), a divinyl cyclotrisiloxane derivative expressed by a formula (3), and a vinyl cyclotrisiloxane derivative expressed by a formula (4) may be exemplified. R in the formulae (2) to (4) is the same as that described in the formula (1).

[Chemical Formula 2]

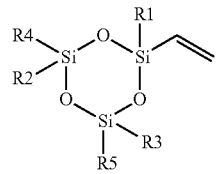

(2)

[Chemical Formula 3]

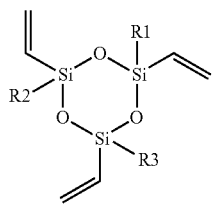

(3)

[Chemical Formula 4]

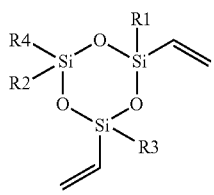

(4)

In regard to the cyclic siloxane, it is preferable that at least one of R1, R3, and R5 in the formula (1) is an unsaturated hydrocarbon group and at least one of R2, R4, and R6 is a saturated hydrocarbon group containing two or more carbon atoms. For example, trivinyl triisopropyl cyclotrisiloxane expressed by a formula (5) may be used.

[Chemical Formula 5]

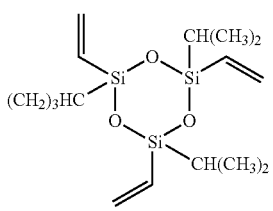

(5)

As described above, the modified layer 13 is formed on the bottom surface of the trench 12. The modified layer 13 is a portion that is inclined such that a content of carbon atoms or nitrogen atoms per unit volume decreases as it goes toward the inside of the insulating film 11 from a surface of the modified layer 13. The content of the carbon atoms or nitrogen atoms per unit volume is constant from an interface of the insulating film 11 to the inside of the insulating film 11. In addition, the modified layer 13 has a mechanical strength larger than that of the insulating film 11. This is considered to be because the hydrocarbon group of the cyclic siloxane expressed by the formula (1) is ended by a C—O coupling composed of a carbon atom and an oxygen atom, or a nitrogen atom (N). The modified layer 13 may have a number of carbon atoms and/or a number of nitrogen atoms per unit volume larger than that inside the insulating film 11. Specifically, the modified layer 13 may be a layer in which the carbon atoms are 20 at % or more to the number of atoms of all the elements making up the insulating film 11. Also, the modified layer 13 may be a layer in which the nitrogen atoms are 20 at % or more, or a layer in which the sum of the carbon atoms and nitrogen atoms is 20 at % or more. As an example, the modified layer 13 may be a layer ranging from a surface of the modified layer 13 to a depth of 2 nm toward the inside of the insulating film 11. In addition, the "surface" of the modified layer 13 is an interface between a metal and the modified layer 13, and is an interface of the barrier metal film 14 and the modified layer 13 in the case of a structure shown in FIG. 1. In a case where the barrier metal film 14 is not provided, the "surface" may be an interface between the interconnect metal 15 and the modified layer 13.

For example, it is preferable that a ratio (C/O) of the number of carbon atoms to the number of oxygen atoms per unit volume in the modified layer 13 is larger than C/O per unit volume inside the insulating film 11. Specifically, C/O in the modified layer 13 may be equal to or more than 0.2 and equal to or less than 0.4. In addition, it is preferable that a ratio (Si/C) of the number of silicon atoms to the number of carbon atoms per unit volume in the modified layer 13 is smaller than Si/C per unit volume inside the insulating film 11. Si/C in the modified layer 13 may be equal to or more than 0.45 and equal to or less than 0.85. A composition of the modified layer 13 can be investigated by performing etching using argon plasma from the surface of the modified layer 13 by an X-ray photoelectron spectroscopy method and measuring an element distribution in regard to oxygen atoms and silicon atoms.

The thickness of the modified layer 13 formed on the bottom surface of the trench 12 is preferably 5 nm or more. In this manner, it is possible to form the modified layer 13 having a mechanical strength higher than that of the insulating film 11, and it is possible to suppress the occurrence of the strain (particularly, the formation of a sub-trench) of the interconnect structure. When the thickness of the modified layer 13 is too large, a dielectric constant is increased, but when the thickness of the modified layer 13 is set to 20 nm or less, the increase in the dielectric constant may be within a problem-free range in practical use. More preferably, the thickness is 10 nm or less.

In addition, the modified layer 13 may be formed on a sidewall of the trench 12. When the modified layer 13 is formed on the sidewall of the trench 12, the mechanical strength becomes high, and it is possible to suppress the strain of the interconnect structure in a polishing process or a mounting process. In the sidewall of the trench 12, the thickness of the modified layer 13 is preferably 3 nm or more. In addition, the thickness of the modified layer 13 formed on the bottom surface of the trench 12 may be larger than that of the modified layer 13 formed on the sidewall of the trench 12.

As shown in FIG. 1, a barrier metal film 14 may be formed on the modified layer 13. Specifically, it is preferable that the barrier metal film 14 is composed of one selected from a group consisting of tantalum (Ta), tantalum nitride (TaN), titanium (Ti), titanium nitride (TiN), and Ruthenium (Ru). The barrier metal film 14 may be formed in a single layer or a plurality of layers laminated. For example, the TaN layer may be formed on a plane that comes into contact with the modified layer 13 and the Ta layer may be formed on the TaN layer.

The interconnect metal 15 is embedded in the trench 12 through the modified layer 13 and the barrier metal film 14. In this manner, the interconnect 10 is formed in the insulating film 11. The interconnect metal 15 may be made of a metal film including copper as a main component, for example, but a metal element other than the copper may be included. The metal element other than the copper included in the interconnect metal 15 may include, for example, at least one kind of metal element selected from a group consisting of aluminum (Al), tin (Sn), titanium (Ti), tungsten (W), silver (Ag), Zirconium (Zr), indium (In), magnesium (Mg), and Manganese (Mn).

An insulating cap film 16 may be formed to cover the interconnect metal 15. The insulating cap film 16 may be formed in a single layer or may be a laminated structure. The insulating cap film 16 may be, for example, an SiCN film, an SiCO film, or a lamination of these films. In addition, after a metal cap film (not shown) is selectively grown on the interconnect metal 15, the insulating cap film 16 may be formed on the metal cap film. In addition, in a case where the metal cap film is formed, the insulating cap film 16 may not be formed. The metal cap film may be configured by a material including cobalt (Co), nickel (Ni), ruthenium (Ru), rhodium (Rh), palladium (Pd), silver (Ag), tin (Sn), antimony (Sb), cadmium (Cd), indium (In), platinum (Pt), gold (Au), lead (Pb), or bismuth (Bi). In addition, the metal cap film may be configured by an alloy of boron (B), nitrogen (N), phosphorus (P), vanadium (V), chromium (Cr), manganese (Mn), iron (Fe), tungsten (W), rhenium (Re), or molybdenum (Mo), and another metal.

Hereinafter, an example of a method of manufacturing the semiconductor device 100 will be described with reference to FIGS. 2A to 4B. First, a semiconductor substrate (for example, silicon substrate) in which semiconductor devices (not shown) are formed is displaced in a reaction chamber, vapor of the cyclic siloxane having a six-membered ring structure where three Si—O units shown in the formula (1) are coupled is diluted with an inert gas (noble gas such as argon, or nitrogen) and is introduced into a plasma inside the reaction chamber, and thereby the insulating film 11 is formed on the semiconductor substrate overheated. The insulating film 11, which is formed at this time, is a porous insulating film formed through a polymerization reaction by plasma energy and heat energy. An oxidant gas such as $N_2O$ may be added to the vapor obtained by diluting the vapor of the cyclic siloxane material having the six-membered ring structure with the noble gas and then the vapor may be introduced to the plasma, and thereby the porous insulating film may be formed on the semiconductor substrate. In addition, the cyclic siloxane that is the raw material may be contained in the formed insulating film 11.

Figure 2A:
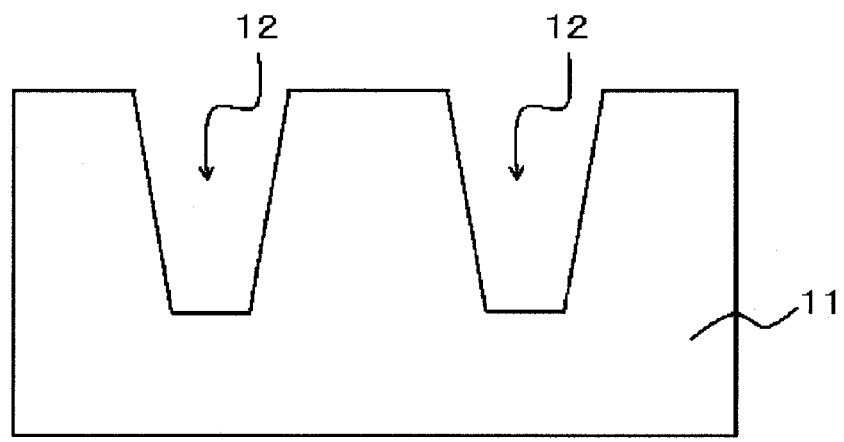
FIGS. 2A and 2B are diagrams illustrating a method of manufacturing the semiconductor device according to the first embodiment.

Then, after performing photolithography, dry etching is performed, and thereby the trench 12 is performed in the insulating film 11 (FIG. 2A). In addition, the trench 12 may be formed using a common damascene process.

Figure 2B:
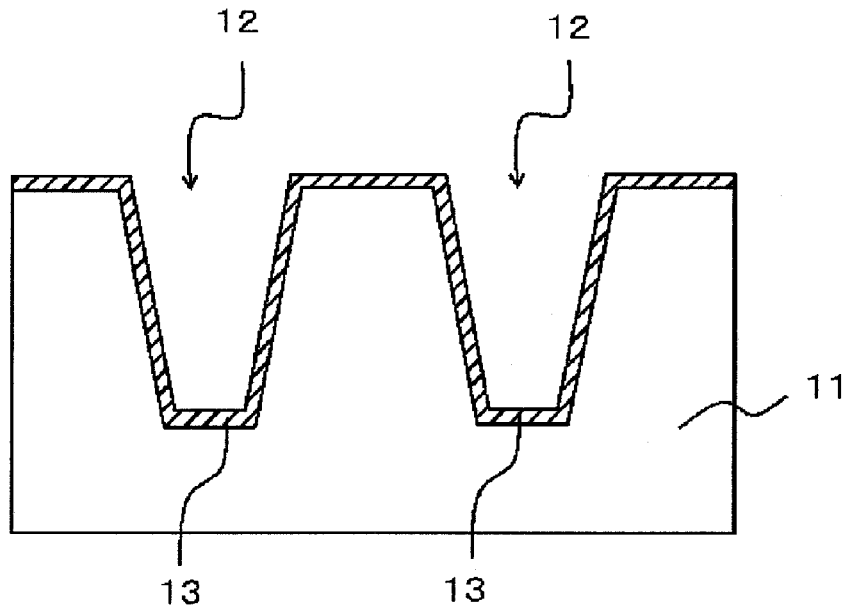

Then, plasma is generated from a carbon-containing gas, a nitrogen-containing gas, or a mixed gas thereof and then the trench 12 is irradiated with the plasma. As the carbon-containing gas, a carbon dioxide ($CO_2$) gas is preferably used. As the nitrogen-containing gas, a nitrogen gas is preferably used. When the $CO_2$ gas is used, it is possible to generate plasma, for example, under a gas flow rate of 100 to 800 sccm, power of 100 to 1000 W, and pressure of 1.4 to 13 Pa (10 to 100 mTorr). The temperature may be set to, for example, room temperature (25° C.). The plasma treatment is preferably performed, for example, for 3 to 60 seconds. In addition, when the mixed gas of the $CO_2$ gas and nitrogen gas is used, the plasma treatment may be performed under a flow rate of the $CO_2$ gas that is set to 50 to 800 sccm, a flow rate of the nitrogen gas that is set to 50 to 600 sccm, and the same power and pressure as those in the case of using the $CO_2$ gas alone. In this manner, it is possible to form the modified layer 13 on the bottom surface of the trench 12 (FIG. 2B). At this time, it is preferable that the modified layer 13 is formed on the sidewall of the trench 12. A gas (for example, argon), which is used in re-sputtering performed at the time of forming the barrier metal film 14 and a seed alloy film 15a described later, is anisotropic. Therefore, it is preferable that the thickness of the modified layer 13 formed on the bottom surface of the trench 12 is larger than that of the modified layer 13 formed on the sidewall of the trench 12. When the plasma treatment is performed under the following conditions, it is possible to make the thickness of the modified layer 13 formed on the bottom surface of the trench 12 larger than that of the modified layer 13 formed on the sidewall of the trench 12.

In addition, the surface of the modified layer 13 may be made to be hydrophobized by performing a hydrogen plasma treatment.

Figure 3A:
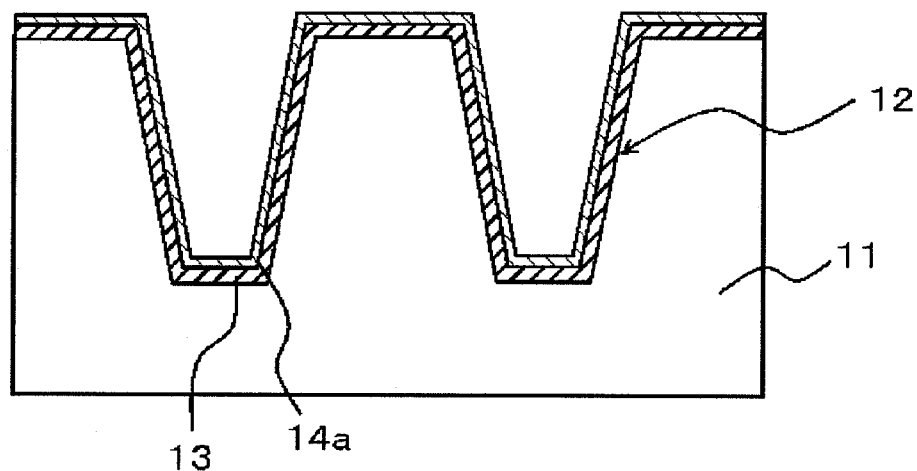
FIGS. 3A and 3B are diagrams illustrating a method of manufacturing the semiconductor device according to the first embodiment.

Then, a first barrier metal film 14a is formed on the modified layer 13 by a sputtering method (FIG. 3A). At this time, when the first barrier metal film 14a is not uniformly formed, the thickness of the barrier metal film 14a, which is formed on the modified layer 13 on the sidewall of the trench 12, may be planarized by etching the first barrier metal film 14a. The first barrier metal film 14a on the bottom surface of the trench 12 and the first barrier metal film 14a formed on a position other than the inside of the trench 12 are removed by etching the first barrier metal film 14a, and the first barrier metal film 14a removed is attached to the modified layer 13 on the sidewall of the trench 12. Therefore, it is possible to planarize the thickness of the barrier metal film 14 on the modified layer 13 of the sidewall of the trench 12 and thereby it is possible to uniformly form the first barrier metal film 14a.

Figure 3B:
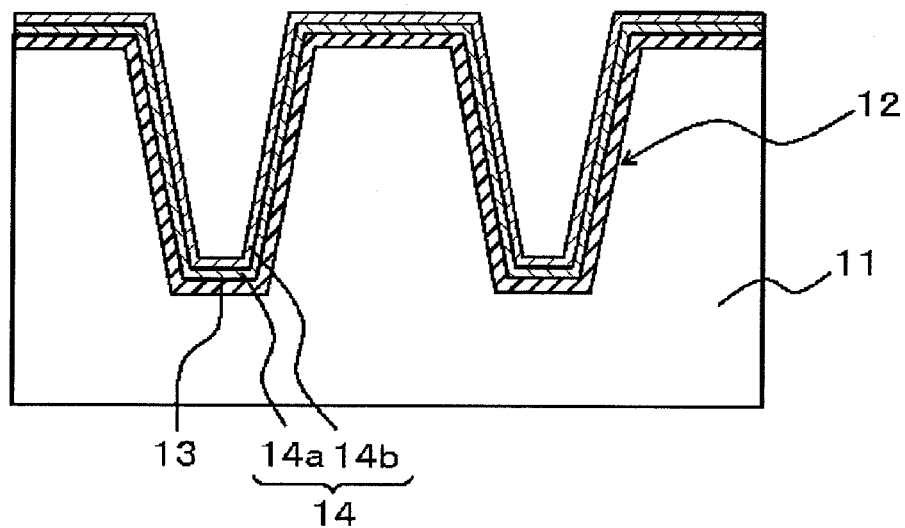

In addition, a second barrier metal film 14b is formed on the first barrier metal film 14a by re-sputtering (FIG. 3B). In this manner, non-uniformity in the thickness of the barrier metal film 14 (hereinafter, the first barrier metal film 14a and the second barrier metal film 14b are collectively referred to as barrier metal film 14) on the sidewall of the trench 12 is more diminished.

When the barrier metal film 14 composed of a laminated structure is formed, the barrier metal film 14 is formed on the sidewall of the trench 12, such that it is possible to repeat sputtering, etching, and re-sputtering for each layer. In addition, as a gas used at the time of forming the barrier metal film 14, a noble gas is preferable, and argon is more preferable.

Figure 4A:
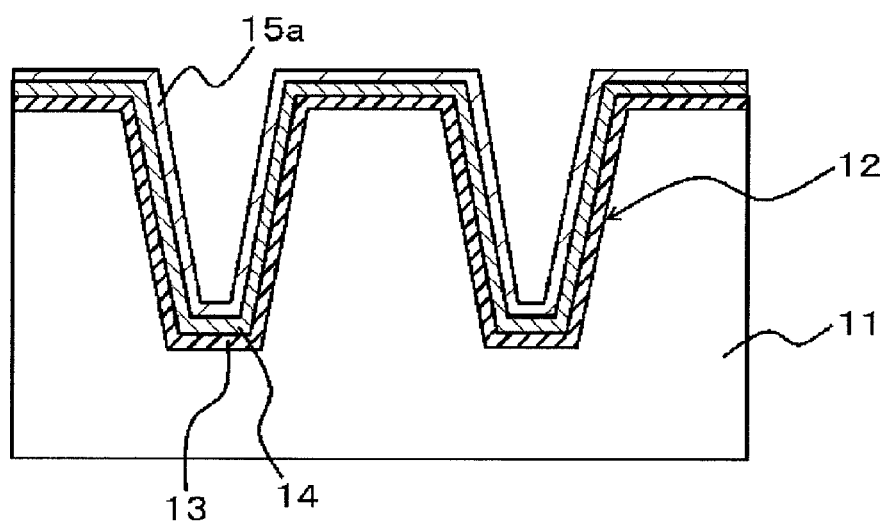
FIGS. 4A and 4B are diagrams illustrating a method of manufacturing the semiconductor device according to the first embodiment.

Then, a seed alloy film 15a is formed on the entire surface of the barrier metal film 14 by a sputtering method (FIG. 4A). As is the case with the barrier metal film 14, the seed alloy film 15a can also be formed by performing sputtering, etching, and re-sputtering. Here, the seed alloy film 15a can be made of an alloy including copper and impurity metal. As the impurity metal, beryllium (Be), magnesium (Mg), zinc (Zn), palladium (Pd), silver (Ag), cadmium (Cd), gold (Au), platinum (Pt), mercury (Hg), manganese (Mn), or titanium (Ti) may be exemplified, and the concentration of impurity metal may be 0.1 to 1.0% by mass. When the range is set in this way, it is possible to afterward form a plated film effectively containing copper as a main component with the seed alloy film included as a seed.

Figure 4B:
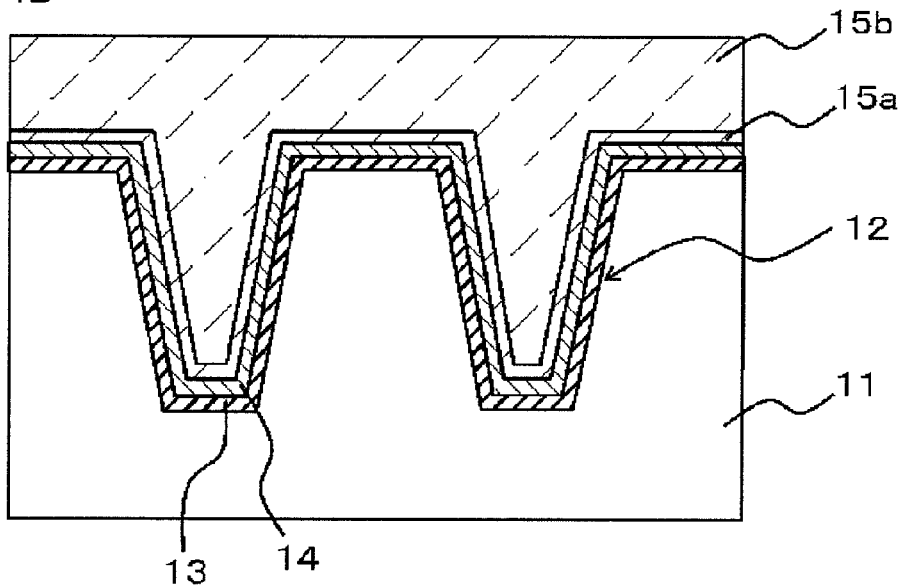

Then, a plated metal film 15b is formed by a plating method, and thereby the inside of the trench 12 is embedded (FIG. 4B). The plated metal film 15b may be configured to contain copper as a main component. In addition, the plated metal film 15b may also be configured to contain impurity metal, but the concentration of the impurity is set to be lower than that of the seed alloy film 15a.

Then, grain growth is performed by annealing. Therefore, the impurity metal in the seed alloy film 15a is diffused. Hereinafter, the seed alloy film 15a and the plated metal film 15b are collectively referred to as interconnect metal 15.

Then, the plated metal film 15b, the seed alloy film 15a, the barrier metal film 14, and the modified layer 13, which are exposed to the outside of the trench 12, are removed by chemical mechanical polishing (CMP). In this manner, an interconnect is formed in the trench 12. The modified layer 13 formed on the sidewall and the bottom surface of the trench 12 is present in the insulating film 11 to cover the trench 12 as it is, such that the mechanical strength is improved.

Then, an insulating cap film 16 is formed on the insulating film 11. Therefore, a structure shown in FIG. 1 is obtained. An interconnect may be formed on the insulating cap film 16 similarly to the above-described method. Then, common processes are performed to complete the semiconductor device.

Subsequently, an operation and an effect of this embodiment will be described. According to this embodiment, the bottom surface of the trench 12 is treated with plasma generated from a carbon-containing gas, a nitrogen-containing gas, or a mixed gas thereof, such that the modified layer 13 having the number of carbon atoms and/or the number of nitrogen atoms per unit volume larger than that inside of the insulating film 11 is formed. According to such a modified layer 13, the mechanical strength is improved, such that when a barrier metal and a seed metal is formed by repeating re-sputtering, it is possible to suppress the occurrence of a sub-trench in the bottom surface of the trench 12. Therefore, it is possible to suppress an increase in an effective inter-interconnect capacitance.

Figure 15:
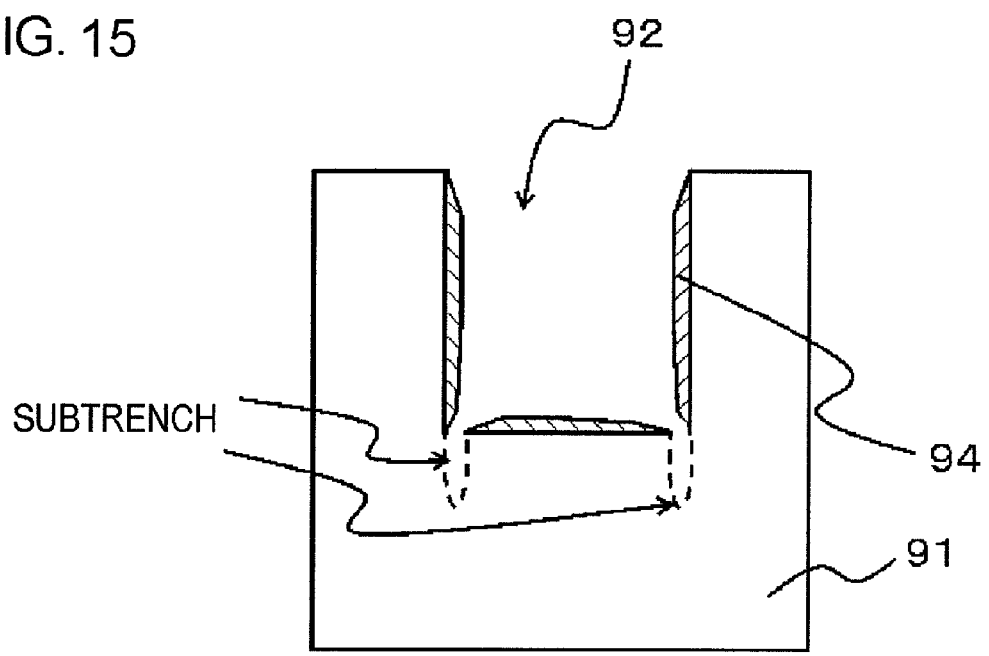
FIG. 15 is a diagram illustrating a reference example.

An example where a sputtering process of the barrier metal is performed without forming the modified layer is shown in FIG. 15. Specifically, an example where a trench 92 is formed on an insulating film 91 formed using, for example, the cyclic siloxane expressed by the formula (5) and then a barrier metal film 94 is formed by repeating re-sputtering without forming the modified layer is shown in FIG. 15. The barrier metal layer 94 formed by sputtering is not uniform, and at an outer edge of the trench 92, the barrier metal is not formed and the insulating film 91 is exposed. However, the re-sputtering is uniformly performed. In this case, since the insulating film 91 has a small mechanical strength, the insulating film 91 is gouged and thereby a sub-trench is formed.

On the other hand, in this embodiment, since the modified layer 13 having mechanical strength higher than that of the insulating film 11 is formed on the insulating film 11, it is possible to suppress the sub-trench from being formed by the re-sputtering. Therefore, it is possible to suppress the increase in the effective capacitance between interconnects.

Figure 5:
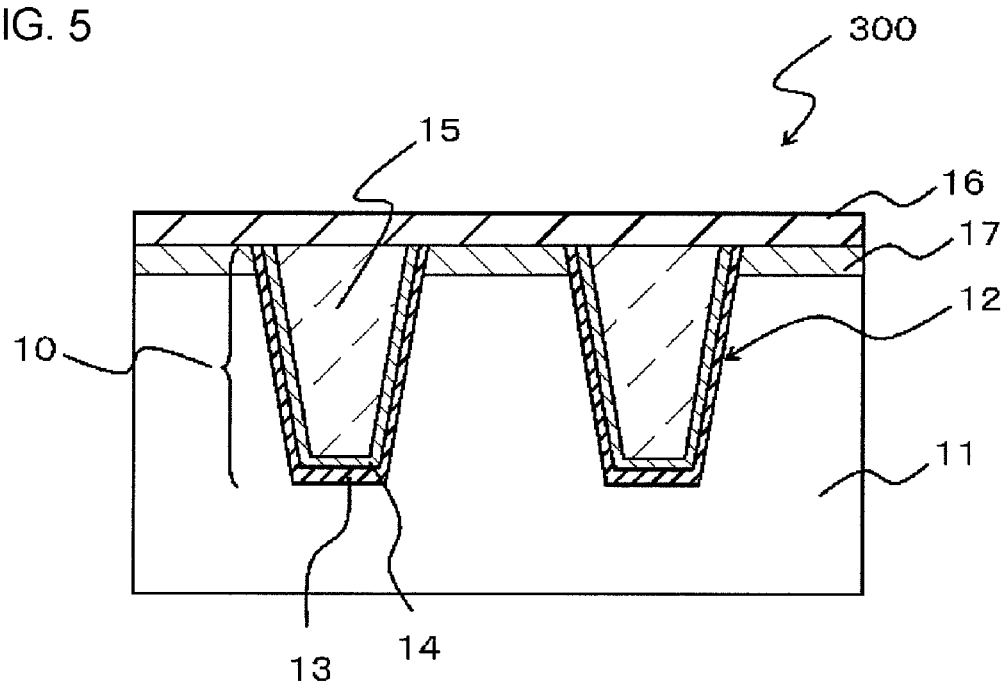
FIG. 5 is a cross-sectional diagram illustrating a modification of the semiconductor device according to the first embodiment.

FIG. 5 shows a diagram illustrating a semiconductor device 300 of a modification of this embodiment. In this modified embodiment, a hard mask 17 is formed on the insulating film 11. The hard mask 17 is an insulating film containing oxygen, nitrogen, carbons, fluorine, or a combination thereof in the silicon. In a case where a structure shown in FIG. 5 is formed, after the hard mask 17 is formed on the insulating film 11, the trench 12 is formed. Therefore, a portion other than the inside of the trench 12 is not exposed to the plasma, such that the modified layer 13 is not formed on the insulating film 11.

Second Embodiment

Figure 6A:
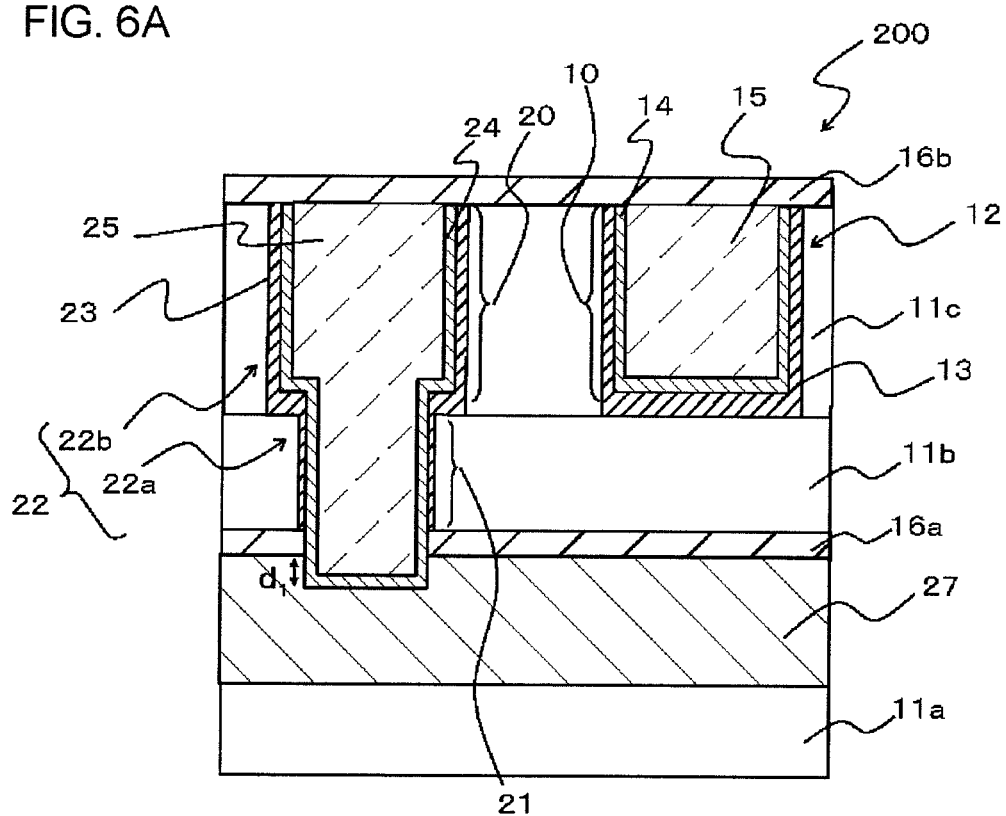
FIG. 6A is a cross-sectional diagram schematically illustrating a semiconductor device according to a second embodiment.
Figure 6B:
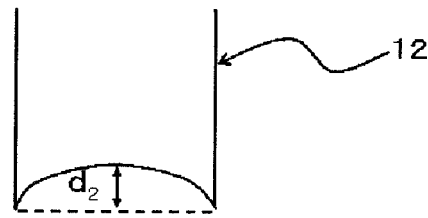
FIG. 6B is a diagram illustrating only a trench of the semiconductor according to the second embodiment.

FIGS. 6A and 6B show schematic cross-sectional diagrams of a semiconductor device 200 that illustrates a second embodiment. As shown in FIG. 6A, the semiconductor device 200 includes insulating interlayers 11a, 11b, and 11c formed with using a cyclic siloxane having a six-membered ring structure as a raw material, a trench 12 formed in the insulating interlayer 11c, and an upper-layer interconnect 10 configured by a metal film (interconnect metal) 15 embedded in the trench 12. A modified layer 13 having a number of carbon atoms and/or nitrogen atoms per unit volume larger than that inside of the insulating interlayer 11c is formed on a bottom surface of the trench 12. In addition, the semiconductor device 200 includes a dual-damascene trench 22 formed in the insulating interlayers 11a and 11b. The dual-damascene trench 22 includes a trench 22b and a via hole 22a connected to a bottom surface of the trench 22b. Specifically, the via hole 22a is formed in the insulating interlayer 11b, and the trench 22b is formed in the insulating interlayer 11c. On a sidewall of each of the via hole 22a and the trench 22b, a modified layer 23 having the number of carbon atoms and/or nitrogen atoms per unit volume larger than that inside the insulating interlayer 11c is formed.

As the insulating interlayers 11b and 11c, the same one as the insulating film 11 described in the first embodiment may be used. In addition, the insulating interlayer 11a may be formed as an insulating film having a dielectric constant lower than that of a silicon dioxide film, but the same one as the insulating film 11 described in the first embodiment may be used. In addition, for example, a porous SiOCH film such as a molecular pore stacking (MPS), a porous SiOC film, a porous SiO film, a dense SiOCH film, a dense SiOC film, a ladder oxide film, or the like may be used. The insulating interlayer 11a is formed over the semiconductor substrate (not shown) in which semiconductor devices are formed.

The trench 12, the modified layer 13, a barrier metal film 14, and the interconnect metal 15 may be configured similarly to those described in the first embodiment.

The modified layer 23 is formed on a sidewall of the via hole 22a. Therefore, the mechanical strength is improved, such that it is possible to suppress the occurrence of the strain of the interconnect structure in a polishing process or a mounting process. The modified layer 23 may be formed in the same process as that forming the modified layer 13 on the sidewall of the trench 12. However, it is preferable that the thickness of the modified layer 23 formed in the sidewall of the via hole 22a is smaller than that of the modified layer 13 formed on the sidewall of the trench 12. That is to say, the thickness of the modified layer 13 formed on the sidewall of the trench 12 may be smaller than that of the modified layer 13 formed on the bottom surface of the trench 12 and may be larger than that of the modified layer 23 formed on the sidewall of the via hole 22a. When the modified layers 13 and 23 are formed by a common plasma treatment, it is possible to form the modified layers 13 and 23 having such a thickness.

Similarly to the modified layer 13, a barrier metal film 24 may be formed on the modified layer 23. The barrier metal film 24 may be configured similarly to the barrier metal film 14 described in the first embodiment. Through a punch-through processing, the bottom surface of the barrier metal film 24 reaches the inside of a lower-layer interconnect 27, as shown in FIG. 6A. On the other hand, the formation of the sub-trench is suppressed. In FIG. 6B, only the trench 12 is shown, but it is configured in a manner such that when a distance between an interface of an insulating cap film 16a and the lower-layer interconnect 27 and the bottom surface of the barrier metal film 24 is set to $d_1$, and a difference in a distance between a portion directly below a center of the bottom surface of the trench 12 and the semiconductor substrate, and a distance between a portion directly below an outer periphery of the bottom surface thereof and the semiconductor substrate is set to $d_2$, $d_1 > d_2$ is satisfied. Specifically, it is preferable that $d_1 - d_2$ ($=\Delta D$) is equal to or more than 3 mm and equal to or less than $d_1$.

A interconnect metal 25 is embedded in the dual-damascene trench 22 through the modified layer 23 and the barrier metal film 24. Therefore, a dual-damascene interconnect is formed in the insulating interlayers 11b and 11c. Specifically, the trench 22b is embedded in the interconnect metal 25 and thereby an upper-layer interconnect 20 is formed, and the via hole 22a is embedded in the interconnect metal 25 and thereby a via plug 21 is formed. The via plug 21 connects the upper-layer interconnect 20 and the lower-layer interconnect 27. The interconnect metal 25 may be configured similarly to the interconnect metal 15 described in the first embodiment.

The semiconductor device 200 includes the lower-layer interconnect 27. As the lower-layer interconnect 27, the same one as the interconnect metal 15 described in the first embodiment may be used.

The insulating cap film 16a may be formed on the insulating interlayer 11a to cover the lower-layer interconnect 27. In addition, an insulating cap film 16b may be formed on the insulating interlayer 11c to cover the interconnect metals 15 and 25. As the insulating cap films 16a and 16b, the same one as the insulating cap film 16 described in the first embodiment may be used.

Subsequently, an example of a method of manufacturing the semiconductor device 200 will be described with reference to FIGS. 7 to 10. First, the insulating interlayer 11a is formed by using a plasma CVD method or the like on a semiconductor substrate (for example, a silicon substrate) in which semiconductor devices (not shown) are formed. Then, the lower-layer interconnect 27 is formed by using a known technology such as a sputtering method using a copper target, a CVD method, and an electrical field plating method. Then, the insulating cap film 16a is formed to cover an exposed surface of the lower-layer interconnect 27 using, for example, a plasma CVD method. The thickness of the insulating cap film may be, for example, 20 to 50 nm. Then, insulating interlayers 11b and 11c are formed on the insulating cap film 16a (FIG. 7). Then, the insulating interlayer 11b and 11c may be formed using the same method as that for forming the insulating film 11 described in the first embodiment. The thickness of the insulating interlayer 11b may be, for example, 20 nm to 200 nm, and the thickness of the insulating interlayer 11c may be, for example, 50 nm to 200 nm.

In addition, an etching stopping layer may be formed between the insulating interlayer 11b and the insulating interlayer 11c. Therefore, it is possible to improve the processability of the via hole 22a and the trench 22b and it is possible to decrease the variation in the depth of the trench 22b. For example, the etching stopping layer may be formed from an $SiO_2$ film, an SiN film, an SiC film, an SiCN film, an SiOC film, an SiOCH film, or the like, and the film thickness may be 5 nm to 50 nm.

Figure 8:
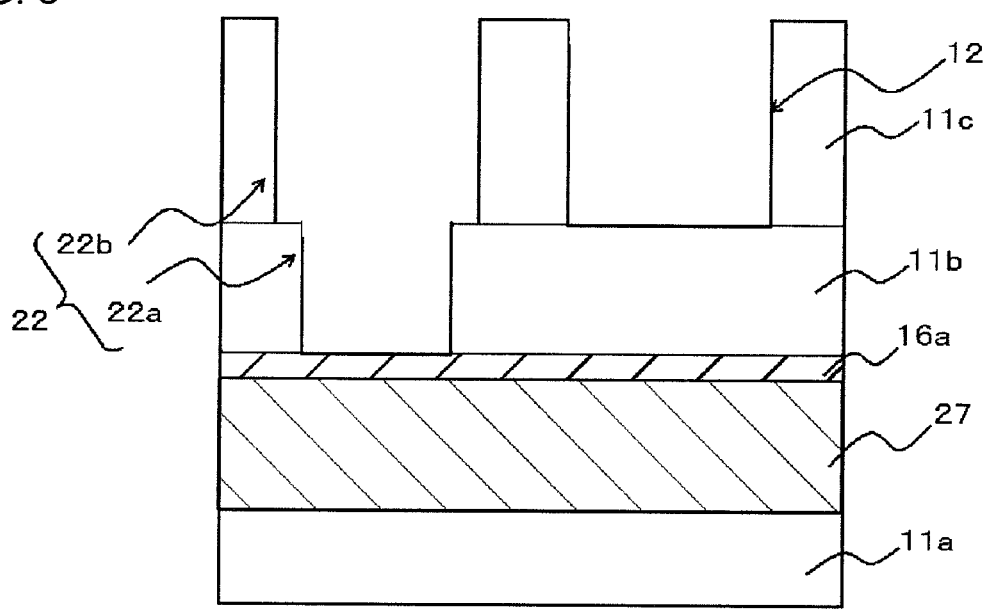
FIG. 8 is a diagram illustrating a method of manufacturing the semiconductor device according to the second embodiment.

Then, after the application of a photoresist, a dry etching is performed, and thereby the trench 12 and the dual-damascene trench 22 are formed. Specifically, the trench 22b is formed to be connected to an upper end of the via hole 22a. In this case, the trench 12 and the dual-damascene trench 22 may be formed by a common dual-damascene method, and the via hole 22a may be first formed by a via-first method and the trench 22b may be first formed by a trench-first method. In a case where the etching stopping layer is formed between the insulating interlayer 11b and the insulating interlayer 11c, a middle-first method may be adopted. The trench 12 is formed concurrently with the dual-damascene trench 22, but the via hole 22a and the trench 12 may be formed concurrently with each other (FIG. 8).

Figure 9:
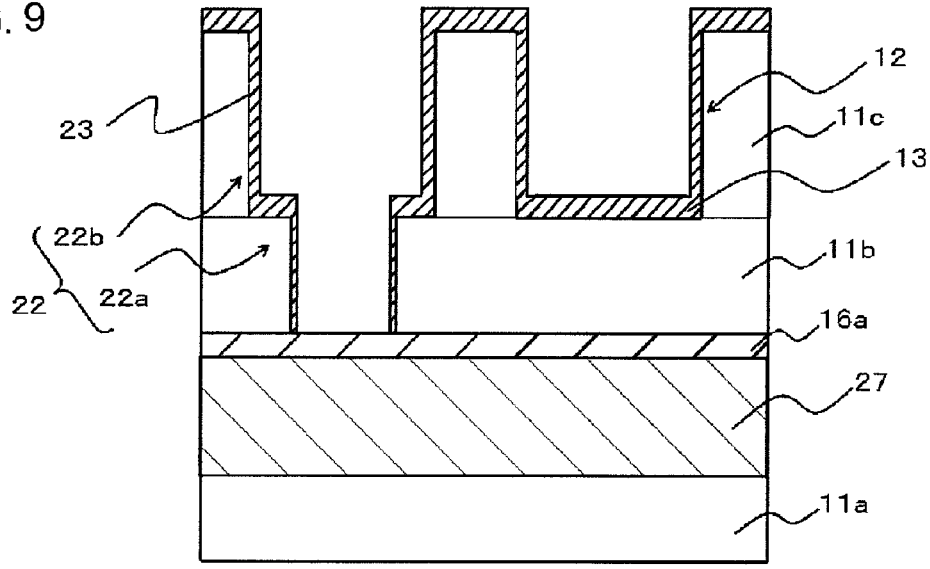
FIG. 9 is a diagram illustrating a method of manufacturing the semiconductor device according to the second embodiment.

Then, using the method described in the first embodiment, plasma is generated from a carbon-containing gas, a nitrogen-containing gas, or a mixed gas thereof and the trench 12 and the dual-damascene trench 22 are irradiated with the generated plasma, and thereby the modified layers 13 and 23 are formed on the bottom surface and the sidewall of the trench 12, the bottom surface of the trench 22b, and the sidewall of the via hole 22a and the trench 22b, respectively (FIG. 9). At this time, it is preferable that the thickness of the modified layer 13 formed on the bottom surface of the trench 12 is set to be larger than that of the modified layer 13 formed on the sidewall of the trench 12, and the thickness of the modified layer 13 formed on the sidewall of the trench 12 is set to be larger than that of the sidewall of the via hole 22a.

Then, after the surface of the modified layer 13 is hydrophobized with hydrogen plasma as necessary, the modified layer 23 formed on the bottom surface of the via hole 22a and the insulating cap film 16a are removed by etchback. After the lower-layer trench 27 is exposed, sputtering, etching, and re-sputtering are sequentially performed using the method described in the first embodiment, and thereby the barrier metal films 14 and 24 are formed on the modified layer 13 and 23, respectively.

Figure 10:
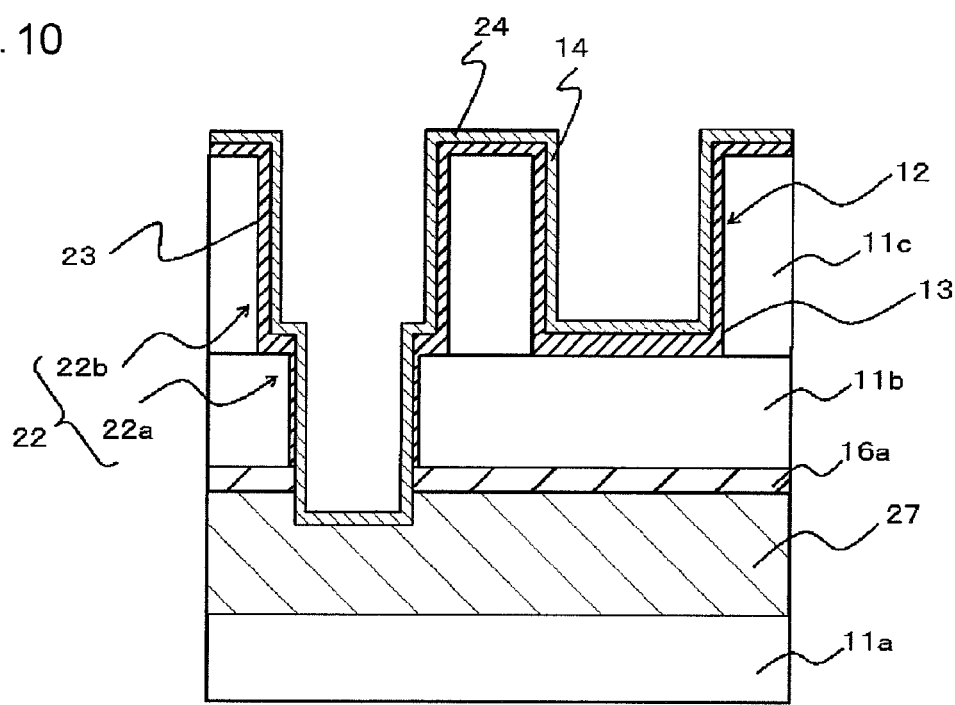
FIG. 10 is a diagram illustrating a method of manufacturing the semiconductor device according to the second embodiment.
Figure 11:
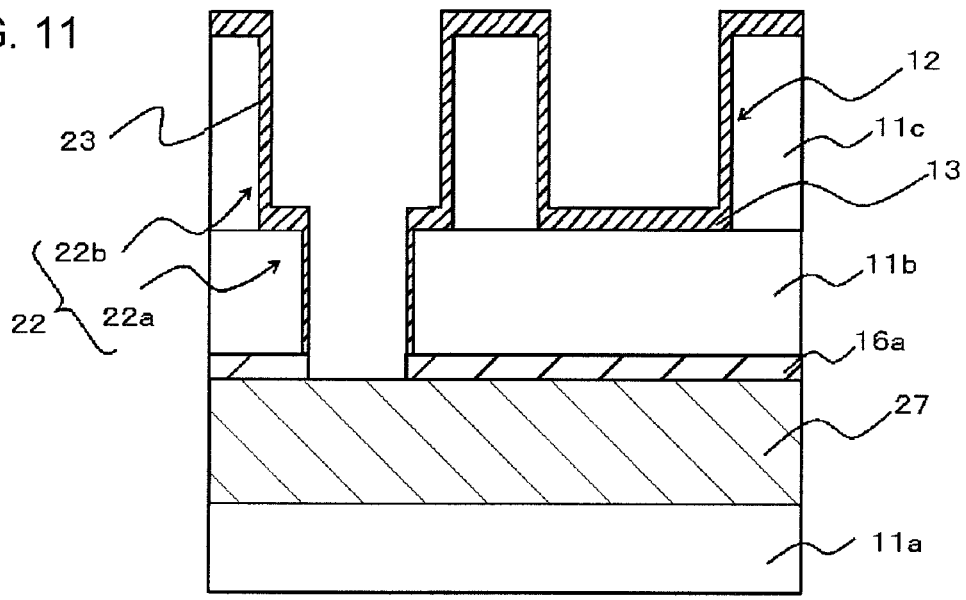
FIG. 11 is a diagram illustrating a method of manufacturing the semiconductor device according to the second embodiment.

Here, as shown in FIG. 10, the barrier metal film 24 may be formed inside the lower-layer interconnect 27, but since the modified layer 13 is formed on the bottom surface of the trench 12, the barrier metal film 24 is not formed inside the insulating interlayer 11b. That is, it is possible to perform the punch-through processing without forming the sub-trench.

Then, as described in the first embodiment, sputtering, etching, and re-sputtering are sequentially performed, and thereby the seed alloy film 15a is formed on the barrier metal films 14 and 24. Then, the plated metal film 15b is embedded in the trench 12 and the dual-damascene trench 22, and then annealing is performed, and thereby the interconnect metals 15 and 25 are formed. Then, CMP polishing is performed, and then the insulating cap film 16b is formed to cover the exposed interconnect metals 15 and 25 by a plasma CVD method or the like, and thereby the structure shown in FIG. 6A is obtained. Then, the insulating interlayers 11a and 11b are formed on the insulating cap film 16b, and a interconnect that is the same as the lower-layer interconnect 27, a dual-damascene interconnect and the upper-layer interconnect formed on the insulating interlayer 11b, or the like may be formed, or these may be laminated. Then, common processes related to the semiconductor device are performed to complete the semiconductor device.

In addition, in this embodiment, in a case where a plasma treatment on the trench 12 and the dual-damascene trench 22 is performed with a $CO_2$ gas or a nitrogen gas, before forming the modified layers 13 and 23, the insulating cap film 16a may be etched back to expose the lower-layer interconnect 27. The $CO_2$ gas or the nitrogen gas has a weak oxidation power to copper, such that there is an effect to prevent the interconnect connection from being deteriorated. In this case, the modified layers 13 and 23 are formed in a state where the lower-layer interconnect 27 is exposed as shown in FIG. 1, instead of being formed as shown in FIG. 9.

According to this embodiment, there may be obtained an effect of improving a trade-off relationship between the punch-through processing and the formation of a sub-trench, in addition to the effect described in the first embodiment.

At the time of forming the barrier metal and the seed metal, the bottom surface of the via hole is also gouged due to re-sputtering. On the other hand, as described in the first embodiment, there is a problem in that the sub-trench is formed in the interconnect trench due to the re-sputtering. However, when the punch-through processing is suppressed by diminishing the re-sputtering, a gouged amount in the bottom surface of the via hole may be diminished. In addition, it is difficult to secure adhesiveness between the barrier metal on the bottom surface of the via hole and the lower-layer interconnect, such that decrease in reliability (particularly, electro migration (EM), and stress induced voiding (SiV)) is caused. Therefore, the promotion of the punch-through processing and the suppressing of the formation of the sub-trench are difficult to be compatible with each other.

On the other hand, according to this embodiment, the modified layer 13 is formed and thereby the bottom surface of the trench 12 is hardened. Therefore, an etching rate to the re-sputtering becomes uniform, such that the sub-trench is difficult to be formed, and it is possible to improve the trade-off relationship between the punch-through processing and the formation of the sub-trench. Accordingly, it is possible to provide a semiconductor device having high reliability.

Figure 12:
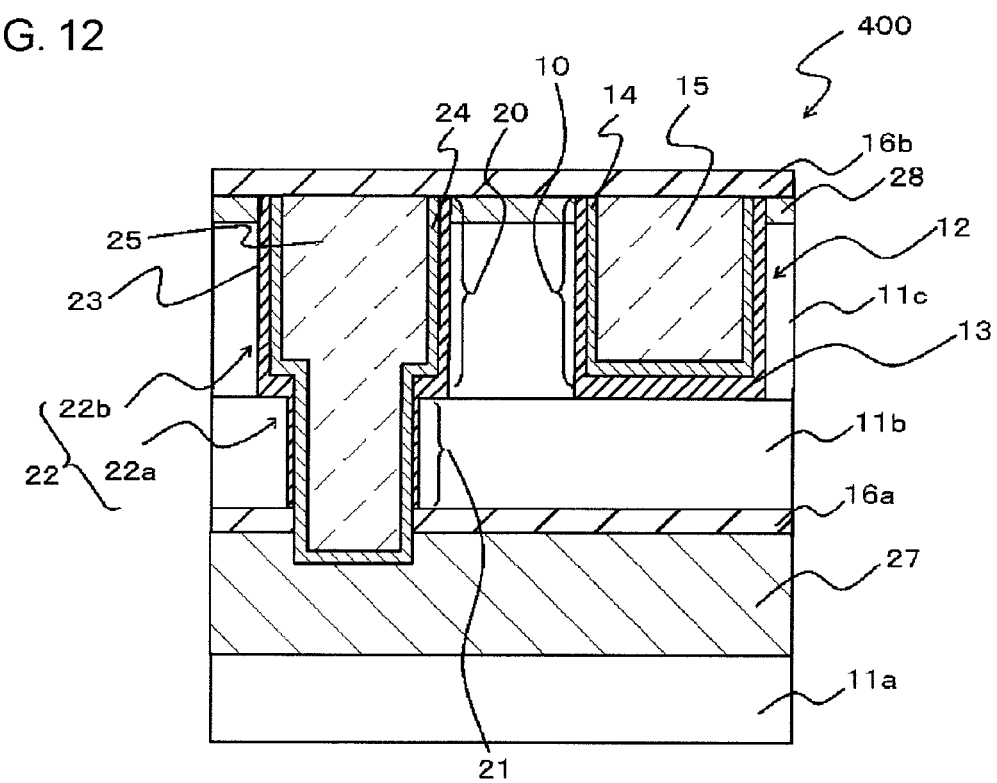
FIG. 12 is a cross-sectional diagram illustrating a modification of the semiconductor device according to the second embodiment.

FIG. 12 shows a diagram illustrating a semiconductor device 400 of a modification of this embodiment. In this modification, a hard mask 28 is formed on the insulating interlayer 11c. As the hard mask 28, the same one as the hard mask 17 described in the first embodiment may be used. In a case where a structure shown in FIG. 12 is formed, after the hard mask 28 is formed on the insulating interlayer 11c, the trench 12 and the dual-damascene trench 22 are formed. Therefore, a portion other than the inside of the trench 12 is not exposed to the plasma, such that the modified layer 13 is not formed on the insulating interlayer 11c.

Hereinbefore, the embodiments of the invention are described with reference to accompanying drawings, these are illustrative only, and various configurations other than those described above may be adopted. For example, in the embodiments, the dual-damascene interconnect is described as an example, but the connecting plug may be a contact layer to be connected to an electrode of a semiconductor device.

EXAMPLES

Example 1

A structure shown in FIG. 1 was prepared. The insulating film 11 was formed by using a compound expressed by the formula (5). The modified layer 13 was formed by performing a plasma treatment on the insulating film 11 inside the trench 12 with a $CO_2$ gas. In regard to plasma generating conditions, the flow rate of the $CO_2$ gas was set to 500 sccm, the power was set to 500 W, and the pressure was set to 6.7 Pa (50 mTorr), and thereby the modified layer 13 with the thickness of 3 nm was formed.

Example 2

The same structures as that in the example 1 were obtained, except that the thicknesses of the modified layers were set to 8.6 nm, 17 nm, and 26 nm, respectively.

Comparative Example 1

The same structure as that in the example 1 was obtained, except that the plasma treatment with the $CO_2$ gas was not performed.

Evaluation 1

Figure 13:
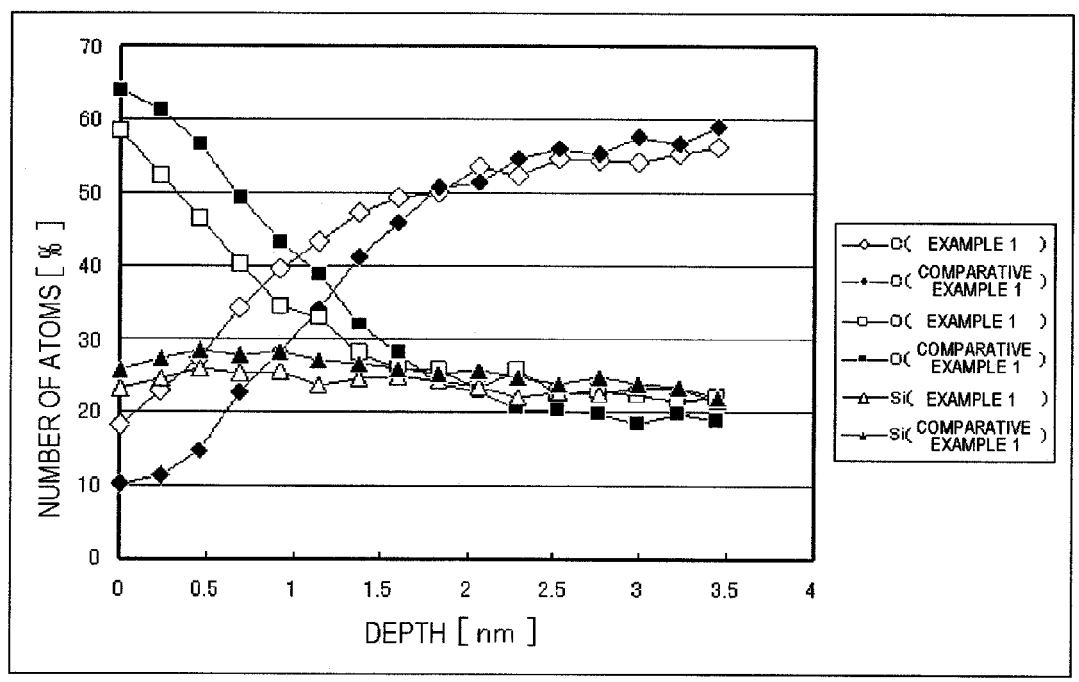
FIG. 13 is a diagram illustrating an example.

With respect to the structures obtained in the example 1 and the comparative example 1, an argon etching was performed from the surface of the modified layer 13 by an X-ray photoelectron spectroscopy method, and element distributions in regard to carbon, oxygen, and silicon in a depth direction were investigated. Results thereof are shown in FIG. 13.

Evaluation 2

Figure 14:
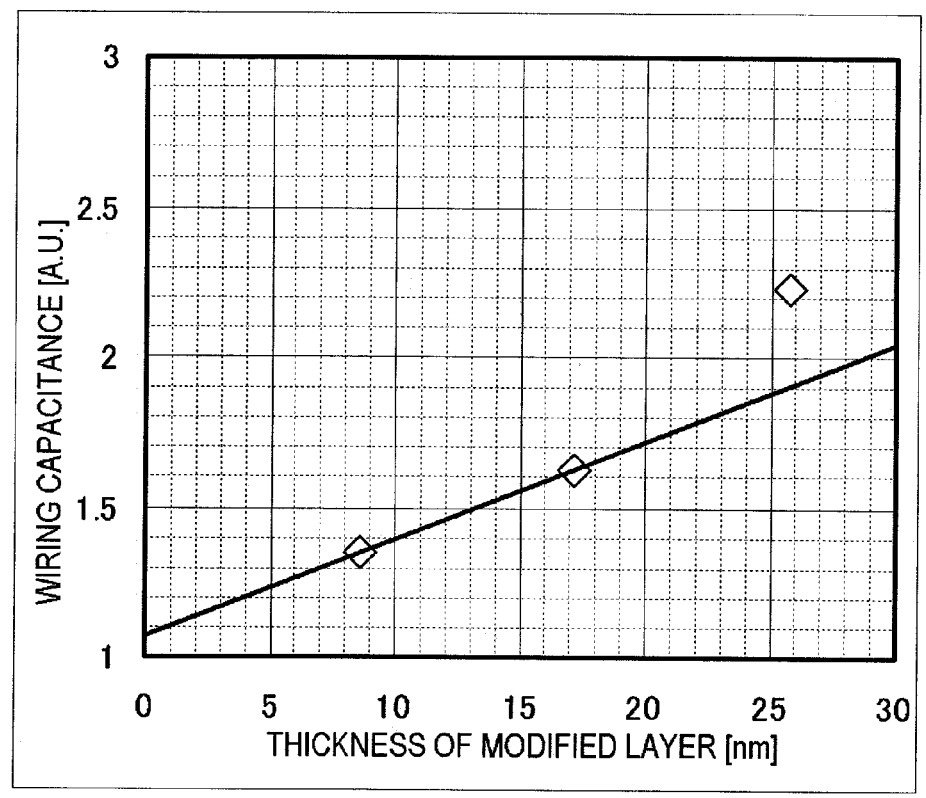
FIG. 14 is a diagram illustrating an example.

With respect to the structures obtained in the example 2, a interconnect capacitance was measured. Results thereof are shown in FIG. 14.

It is apparent that the present invention is not limited to the above embodiment, and may be modified and changed without departing from the scope and spirit of the invention.

Further Exemplary Embodiment 1

A semiconductor device, comprising:
an insulating film that is formed with using a cyclic siloxane having a six-membered ring structure as a raw material;
a trench that is formed in the insulating film; and
an interconnect that is configured by a metal film embedded in the trench,
wherein, a modified layer is formed on a bottom surface of the trench, in which the number of carbon atoms and/or the number of nitrogen atoms per unit volume is larger than that inside the insulating film.

Further Exemplary Embodiment 2

The semiconductor device according to Further exemplary embodiment 1,
wherein in the organic siloxane having a six-membered ring structure, a skeleton is composed of silicon and oxygen, one of side chains coupled to the silicon is an unsaturated hydrocarbon group, the other is a saturated hydrocarbon group containing two or more carbon atoms.

Further Exemplary Embodiment 3

The semiconductor device according to Further exemplary embodiment 1, further comprising:
a via hole which is formed in the insulating film and is connected to a bottom surface of the trench,
wherein the modified layer is formed on a sidewall of the via hole.

Further Exemplary Embodiment 4

The semiconductor device according to Further exemplary embodiment 3,
wherein a thickness of the modified layer formed on the bottom surface of the trench is larger than that of the modified layer formed on the sidewall of the via hole.

Further Exemplary Embodiment 5

The semiconductor device according to Further exemplary embodiment 4,
wherein the modified layer is formed on a sidewall of the trench, and
a thickness of the modified layer formed on the sidewall of the trench is smaller than that of the modified layer formed on the bottom surface of the trench and is larger than that of the modified layer formed on the sidewall of the via hole.

Further Exemplary Embodiment 6

The semiconductor device according to Further exemplary embodiment 1,
wherein the modified layer is formed on the sidewall of the trench, and
a thickness of the modified layer formed on the bottom surface of the trench is larger than that of the modified layer formed on the sidewall of the trench.

Further Exemplary Embodiment 7

The semiconductor device according to Further exemplary embodiment 1, wherein a ratio (C/O) of the number of carbon atoms to the number of oxygen atoms per unit volume in the modified layer is larger than C/O per unit volume inside the insulating film.

Further Exemplary Embodiment 8

The semiconductor device according to Further exemplary embodiment 1,
wherein a ratio (Si/C) of the number of silicon atoms to the number of carbon atoms per unit volume in the modified layer is smaller than Si/C per unit volume inside the insulating film.

What is claimed is:

1. A method of manufacturing a semiconductor device comprising:
   forming a first insulating film using a cyclic siloxane having a six-membered ring structure as a raw material;
   forming a second insulating film over the first insulating film, using a cyclic siloxane having a six-membered ring structure as a raw material;
   forming a trench in the second insulating film;
   forming a via hole in the first insulating film such that an upper end of the via hole is connected to a bottom surface of the trench;
   forming a modified layer on the bottom surface of the trench by treating the bottom surface of the trench with plasma generated from a carbon dioxide gas, wherein in forming the trench and the via hole in the first and second insulating films, the modified layer is formed on a sidewall of the via hole, and further wherein in forming the modified layer, the modified layer is formed on a bottom surface of the via hole concurrently when the modified layer is formed on the bottom surface of the trench; and
   forming an interconnect by embedding the trench with a metal film.

2. The method of manufacturing a semiconductor device according to claim 1, further comprising treating a surface of the modified layer with hydrogen plasma, after forming the modified layer.

3. The method according to claim 1,
wherein the modified layer is formed to have more carbon atoms per unit than the insulating film.

4. The method according to claim 3,
wherein the modified layer contains at least 20 at % of carbon.

* * * * *